United States Patent
Ryu et al.

(10) Patent No.: US 8,928,027 B2
(45) Date of Patent: Jan. 6, 2015

(54) SEMICONDUCTOR LIGHT EMITTING DEVICE

(71) Applicant: Samsung Electronics Co., Ltd., Suwon-si, Gyeonggi-do (KR)

(72) Inventors: Yung Ho Ryu, Gyeonggi-do (KR); Hae Yeon Hwang, Gyeonggi-do (KR); Young Chul Shin, Seoul (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

(21) Appl. No.: 14/075,519

(22) Filed: Nov. 8, 2013

(65) Prior Publication Data

US 2014/0061713 A1    Mar. 6, 2014

Related U.S. Application Data

(63) Continuation of application No. 13/223,877, filed on Sep. 1, 2011, now Pat. No. 8,581,293.

(30) Foreign Application Priority Data

Nov. 1, 2010   (KR) .................. 10-2010-0107809

(51) Int. Cl.
*H01L 29/22* (2006.01)
*H01L 33/38* (2010.01)
*H01L 33/20* (2010.01)
*H01L 27/15* (2006.01)
*H01L 33/08* (2010.01)
*H01L 33/42* (2010.01)
*H01L 33/44* (2010.01)

(52) U.S. Cl.
CPC ............... *H01L 33/38* (2013.01); *H01L 33/20* (2013.01); *H01L 33/387* (2013.01); *H01L 27/153* (2013.01); *H01L 33/08* (2013.01); *H01L 33/42* (2013.01); *H01L 33/44* (2013.01)
USPC .......... 257/99; 257/98; 257/100; 257/E33.063; 257/E33.065

(58) Field of Classification Search
USPC ............... 257/98, 99, 100, E33.063, E33.065
See application file for complete search history.

(56) References Cited

U.S. PATENT DOCUMENTS

| | | | |
|---|---|---|---|
| 6,507,041 | B2 | 1/2003 | Nakamura et al. |
| 6,614,056 | B1 | 9/2003 | Tarsa et al. |

(Continued)

FOREIGN PATENT DOCUMENTS

| | | |
|---|---|---|
| CN | 1502154 A | 6/2004 |
| CN | 101645482 A | 2/2010 |

(Continued)

OTHER PUBLICATIONS

Chinese Office Action with English translation issued in Chinese Application No. 201110282791.8 issued on Nov. 29, 2013.

*Primary Examiner* — Andy Huynh
(74) *Attorney, Agent, or Firm* — McDermott Will & Emery LLP

(57) ABSTRACT

A semiconductor light emitting device includes: a first conductive semiconductor layer including first and second areas; an active layer disposed on the second area; a second conductive semiconductor layer disposed on the active layer; first and second electrode branches disposed on the first and second conductive semiconductor layers, respectively; a first electrode pad electrically connected to the first electrode branch and disposed on the first electrode branch; and a second electrode pad electrically connected to the second electrode branch and disposed on the second electrode branch.

10 Claims, 9 Drawing Sheets

(56) References Cited

U.S. PATENT DOCUMENTS

| 7,230,263 B2* | 6/2007 | Kawagoe ................ 257/13 |
| 2004/0124500 A1 | 7/2004 | Kawagoe |
| 2005/0212002 A1 | 9/2005 | Sanga et al. |
| 2007/0023777 A1 | 2/2007 | Sonobe et al. |
| 2008/0096297 A1 | 4/2008 | Schiaffino et al. |
| 2008/0185606 A1 | 8/2008 | Sano et al. |
| 2010/0032701 A1 | 2/2010 | Fudeta |

FOREIGN PATENT DOCUMENTS

| JP | 2009-295611 A | 12/2009 |
| KR | 2008-0072555 A | 8/2008 |

* cited by examiner

SEMICONDUCTOR LIGHT EMITTING DEVICE

CROSS-REFERENCE TO RELATED APPLICATIONS

This application is a Continuation of U.S. Application No. 13/223,877, filed on Sep. 1, 2011, which claims the priority of Korean Patent Application No. 10-2010-0107809 filed on Nov. 01, 2010, in the Korean Intellectual Property Office, the disclosure of which is incorporated herein by reference.

BACKGROUND OF THE INVENTION

1. Field of the Invention

The present invention relates to a semiconductor light emitting device.

2. Description of the Related Art

A light emitting diode, a type of semiconductor light emitting device, is a semiconductor device capable of generating light of various colors according to electron hole recombination in p and n type semiconductor junction parts when current is applied thereto. Compared with a light emitting device based on a filament, the semiconductor light emitting device has various advantages such as a long life span, low power consumption, excellent initial driving characteristics, high vibration resistance, and the like, so demand for the semiconductor light emitting device continues to grow. In particular, recently, a group III-nitride semiconductor capable of emitting short-wavelength blue light has come to prominence.

In the nitride semiconductor light emitting device, electrodes are generally arranged in a horizontal direction, narrowing a current flow. The narrow current flow increases an operation voltage Vf of the light emitting device, degrading current efficiency, and in addition, the light emitting device may become vulnerable to an electrostatic discharge. Thus, in an effort to uniformly spread current on the overall light emission surface, the electrodes are divided into pads and fingers and disposed thusly.

However, in such a structure, an active layer is etched to expose a first conductive semiconductor layer, and a first pad and finger are formed on the first conductive semiconductor layer and a second pad and finger are formed on a second conductive semiconductor layer. Thus, the area of the active layer is reduced and a uniform space between the electrodes cannot be secured to cause non-uniform current spreading.

Thus, the object of the present invention is to obtain uniform current spreading by maintaining a uniform interval between the electrodes of a semiconductor light emitting device, and improve the luminance of the semiconductor light emitting device by avoiding a loss of (i.e., reduction in) an active layer resulting from etching.

SUMMARY OF THE INVENTION

An aspect of the present invention provides a semiconductor light emitting device having electrodes for minimizing a loss of light and improving a current spreading effect.

According to an aspect of the present invention, there is provided a semiconductor light emitting device including: a first conductive semiconductor layer including first and second areas; an active layer disposed on the second area; a second conductive semiconductor layer disposed on the active layer; first and second electrode branches disposed on the first and second conductive semiconductor layers, respectively; a first electrode pad electrically connected to the first electrode branch and disposed on the first electrode branch; and a second electrode pad electrically connected to the second electrode branch and disposed on the second electrode branch.

The first and second areas may have a stripe shape.

The first and second electrode branches may have a stripe shape.

A plurality of first and second electrode branches may be disposed and alternately formed.

The semiconductor light emitting device may further include: an insulating part formed on the first and second conductive semiconductor layers.

The insulating part may allow at least a portion of each of upper surfaces of the first and second electrode branches to be exposed.

The first and second electrode pads may be disposed on the exposed portions of the upper surfaces of the first and second electrode branches, respectively.

The insulating part may cover the upper portions of the first and second electrode branches, and at least one first conductive via electrically connected to the first electrode branch and at least one second conductive via electrically connected to the second electrode branch may be penetratingly formed through portions of the insulating part in a thicknesswise direction.

The first and second conductive vias may be penetratingly formed through the insulating part in a vertical direction.

The first and second electrode pads may be disposed on the insulating part, and the first electrode pad may be electrically connected to the first electrode branch through the first conductive via, and the second electrode pad may be electrically connected to the second electrode branch through the second conductive via.

The semiconductor light emitting device may further include: a first connection part extending from the first electrode pad to the first conductive via along the upper surface of the insulating part, and a second connection part extending from the second electrode pad to the second conductive via along the upper surface of the insulating part.

At least one of the first and second connection parts may be provided as a plurality of connection parts.

The first connection part may be connected to the plurality of first conductive vias, and the second connection part may be connected to the plurality of second conductive vias.

The upper surface of the insulating part may have a rectangular shape, and the first conductive vias may be arranged along one side of the upper surface of the insulating part and the second conductive vias may be arranged along the other side opposed to the one side.

The upper surface of the insulating part may have a rectangular shape, and the second electrode pads may be disposed to be adjacent to one corner and neighboring another corner of the upper surface of the insulating part, and the first electrode pad may be disposed at a position spaced apart by the same distance from the respective second electrode pads.

The insulating part may be formed to include a silicon oxide.

The semiconductor light emitting device may further include: a transparent electrode layer formed on the upper surface of the second conductive semiconductor layer.

The second electrode branch may be disposed on an upper surface of the transparent electrode layer.

At least one of the first and second electrode pads may be disposed as a plurality of electrode pads.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
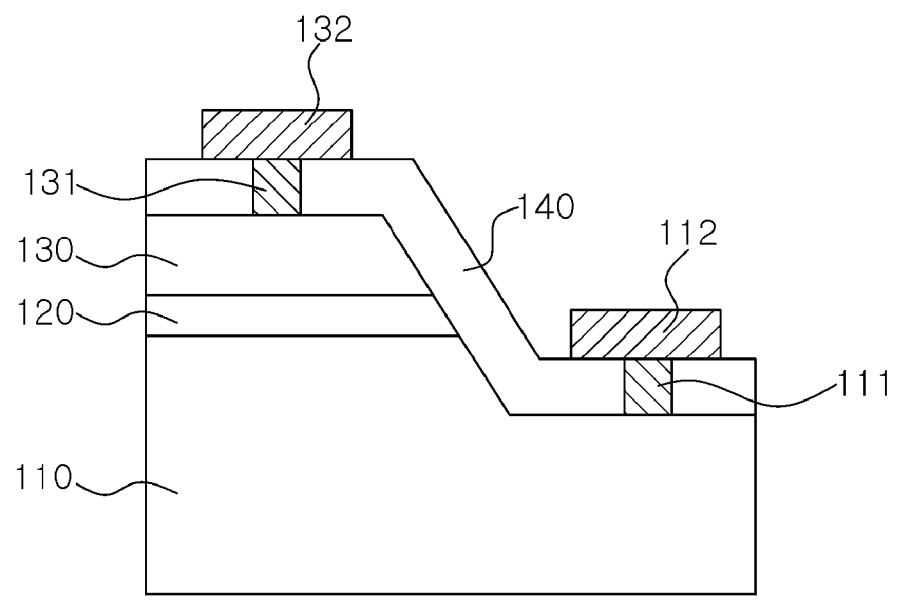
FIGS. 1a and 1b are a schematic sectional view and a plan view of a semiconductor light emitting device according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

Figure 1B:
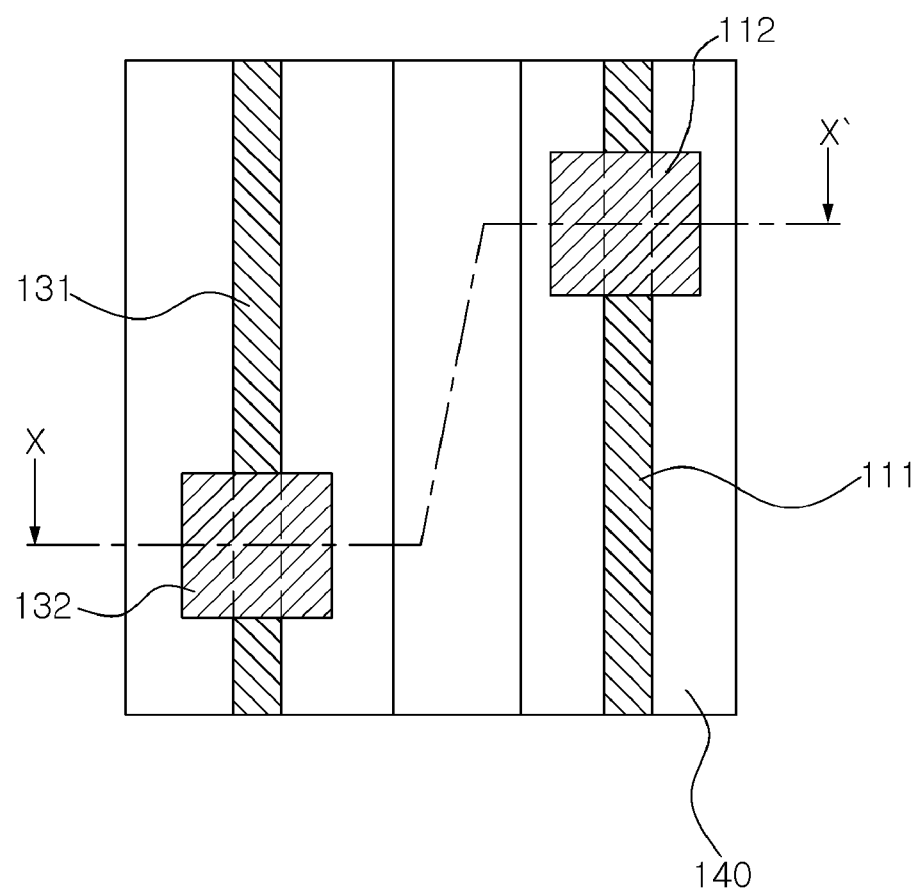

FIGS. 1a and 1b are a schematic sectional view and a plan view of a semiconductor light emitting device according to an exemplary embodiment of the present invention. Specifically, FIG. 1a is a sectional view taken along line X-X' in FIG. 1b.

With reference to FIGS. 1a and 1b, a semiconductor light emitting device according to the present exemplary embodiment includes a first conductive semiconductor layer 110 including first and second areas, an active layer 120 disposed on the second area, a second conductive semiconductor layer 130 disposed on the active layer 120, first and second electrode branches 111 and 131 respectively disposed on the first and second conductive semiconductor layers 110 and 130, a first electrode pad 112 electrically connected to the first electrode branch 111 and disposed to be separated from the first conductive semiconductor layer 110, a second electrode pad 132 electrically connected to the second electrode branch 131 and disposed to be separated from the second conductive semiconductor layer 130, and an insulating part 140 formed on the first and second conductive semiconductor layers 110 and 130. Hereinafter, the respective elements and their connective relationships within the semiconductor light emitting device according to the present exemplary embodiment will be described in detail with reference to the accompanying drawings.

In the light emission structure including the first and second conductive semiconductor layers 110 and 130 and the active layer 120 formed between the first and second conductive semiconductor layers, the first area may be defined as an area of the first conductive semiconductor layer 110 exposed by removing a portion of the light emission structure, and the second area may be defined as the other remaining area, excluding the first area. This configuration can be obtained through a process of selectively etching a portion of the light emission structure as could be easily understood by a person skilled in the art to which the present invention pertains.

Also, in the light emission structure, the first and second conductive semiconductor layers 110 and 130 may be made of a nitride semiconductor, specifically, a material expressed by an empirical formula $Al_xIn_yGa_{(1-x-y)}N$ (Here, $0 \le x \le 1$, $0 \le y \le 1$, $0 \le x+y \le 1$). For example, the material may include GaN, AlGaN, and InGaN. The active layer 120 formed between the first and second conductive semiconductor layers 110 and 130 emits light having certain energy according to electron hole recombination and may have a multi-quantum well (MQW) structure in which a quantum well and a quantum barrier are alternately stacked. In this case, for example, an InGaN/GaN structure may be used as the MQW structure. Meanwhile, the first and second conductive semiconductor layers 110 and 130 and the active layer 120 may be formed by using a semiconductor layer growing process such as metal organic chemical vapor deposition (MOCVD), molecular beam epitaxy (MBE), hydride vapor phase epitaxy (HVPE), or the like, well known in the art.

Preferably, the first and second areas are formed to be parallel in a lengthwise direction. With such a configuration, the formation of a structure for maximizing a current spreading effect can be facilitated in disposing electrode branches and electrode pads. However, the present invention is not limited thereto, and various other forms of exposing areas can be employed so long as they can expose the first and second conductive semiconductor layers 110 and 130 and connect them to electrode branches.

The first and second electrode branches 111 and 131 are disposed on the first and second conductive semiconductor layers, respectively, exposed as described above. Preferably, the first and second electrode branches 111 and 131 may be formed to be in direct contact with the first and second conductive semiconductor layers 110 and 130, respectively. Accordingly, the first and second electrode branches 111 and 131 can be firmly electrically connected to the upper surfaces of the first and second conductive semiconductor layers 110 and 130. More preferably, the first and second areas are formed to be parallel to each other in a lengthwise direction and the first and second electrode branches 111 and 131 may be formed in a linear manner in the same direction. Also, in the present exemplary embodiment, in order to make a current flow conducted between the first and second electrode branches 111 and 131 uniform overall, a uniform interval is maintained between the first and second electrode branches 111 and 131.

The insulating part 140 may be formed on the upper surfaces of the conductive semiconductor layers 110 and 130. In this case, preferably, the height (or thickness) of the insulating part 140 may be lower (or smaller) than that of the first and second electrode branches 111 and 131 or may be equal to that of the first and second electrode branches 111 and 131 in the meaning that it is within the margin of error (or tolerance) in the process. With such a configuration, at least a portion of the upper surface of each of the first and second electrode branches 111 and 131 can be exposed and can be easily electrically connected to each of the first and second electrode pads 112 and 132.

The first and second electrode pads 112 and 132 are formed on the first and second electrode branches 111 and 131, and are electrically connected with the first and second electrode branches 111 and 131, respectively. In the present exemplary embodiment, the first and second electrode pads 112 and 132 are provided such that they are in direct contact with the exposed upper surfaces of the first and second electrode branches 111 and 131. Also, the first and second electrode pads 112 and 132 are physically separated from the first and second conductive semiconductor layers 110 and 130 by means of the insulating part 140 and electrically connected to the first and second conductive semiconductor layers 110 and 130 only through the first and second electrode branches 111 and 131.

Accordingly, current can be uniformly distributed regardless of the shape and width of the first and second electrode pads 112 and 132 and the interval between the first and second electrode pads 112 and 132. In detail, in the related art semiconductor light emitting device, the electrode pads, as well as the electrode branches, are also formed to be in direct contact with the semiconductor layer. In this case, although the interval between the electrode branches is uniformly maintained, the interval between the pads which have a relatively large width and area and the interval between the pads and the electrode branches are different from the interval between the electrode branches which are uniformly maintained, making the current flow through the semiconductor layer non-uniform overall. Comparatively, in the present exemplary embodiment, only the first and second electrode branches 111 and 131 are in direct contact with the semiconductor layers, while the first and second electrode pads 112 and 132 are spatially separated from the first and second conductive semiconductor layers 110 and 130 and electrically connected to the first and second conductive semiconductor layers only through the first and second electrode branches 111 and 131. Thus, compared with the related art structure, the current flow can be significantly improved by simply maintaining the uniform interval between the first and second electrode branches 111 and 131.

Preferably, the first and second electrode pads 112 and 132 are positioned to be as distant as possible from each other. For example, as shown in FIG. 1a, the first and second electrode pads 112 and 132 are formed at the respective opposed corners on the upper surface of the insulating part 140, thereby improving the current flow distribution.

Figure 2A:
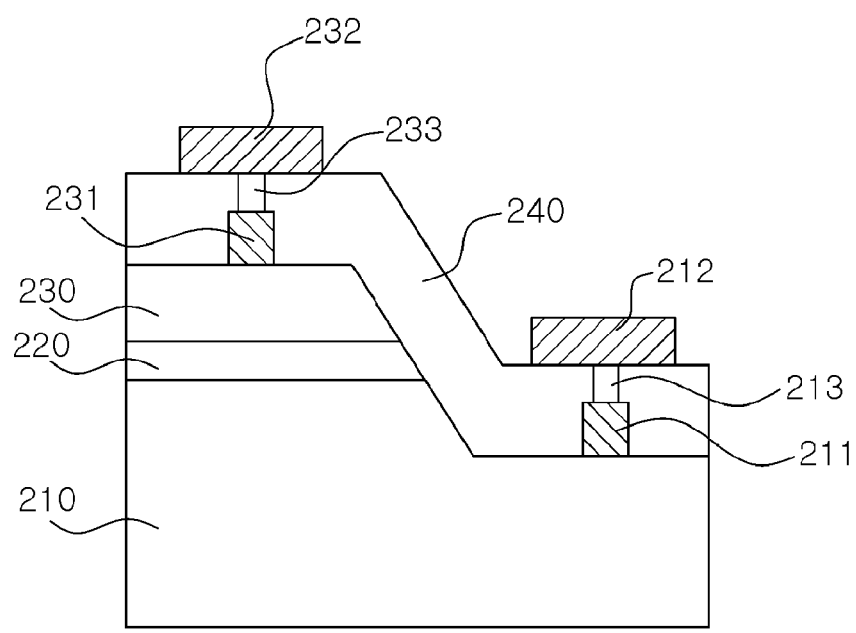
FIGS. 2a and 2b are a schematic sectional view and a plan view of a semiconductor light emitting device according to an exemplary embodiment of the present invention.
Figure 2B:
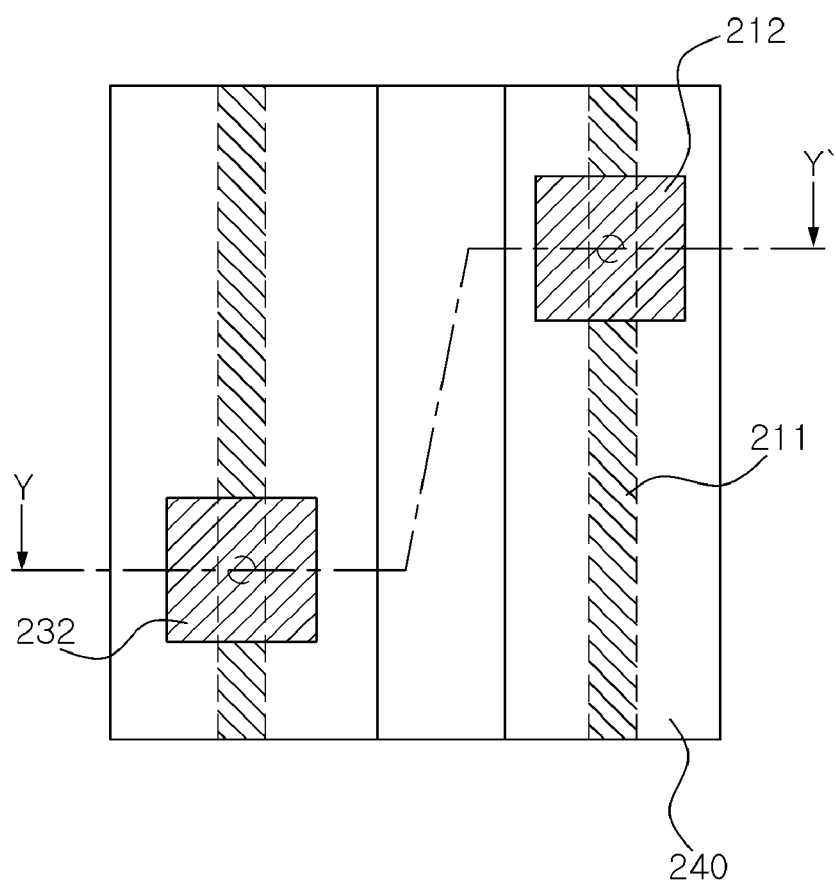

FIGS. 2a and 2b are a schematic sectional view and a plan view of a semiconductor light emitting device according to an exemplary embodiment of the present invention. Specifically, FIG. 2a is a sectional view taken along line Y-Y' of FIG. 2b.

With reference to FIGS. 2a and 2b, the semiconductor light emitting device according to the present exemplary embodiment has the same configuration as that of the semiconductor light emitting device according to the former exemplary embodiment described above with reference to FIGS. 1a and 1b, except that first and second conductive vias 213 and 233 are formed between first and second electrode pads 212 and 232 and first and second electrode branches 211 and 231 and an insulating part 240 covers the entire upper surfaces of the first and second conductive semiconductor layers 210 and 230 including the upper surfaces of the first and second electrode branches 211 and 231. Hereinafter, the configuration of the first and second conductive vias 213 and 233 and their connective relationships will now be described in detail.

In the present exemplary embodiment, the insulating part 240 insulates the first and second electrode branches 211 and 231 by covering them, and the at least one first conductive via 213 is formed at an area of the insulating part 240 such that it is electrically connected to the first electrode branch 211 through the insulating part 240 (i.e., in a penetrative manner) in a thicknesswise direction thereof, and the at least one second conductive via 233 is formed at an area of the insulating part 240 such that it is electrically connected to the second electrode branch 231 through the insulating part 240 (i.e., in a penetrative manner) in the thicknesswise direction thereof. Accordingly, the first and second electrode branches 211 and 231 are completely covered by the insulating part 240 so as to be insulated and can be connected to the first and second electrode pads 212 and 232, respectively, through the first and second conductive vias 213 and 233. This configuration of forming the first and second conductive vias 213 and 233 is particularly meaningful when the plurality of first and second electrode branches 211 and 231 are formed, details of which will be described later. However, the present invention is not necessarily limited thereto.

Figure 3:
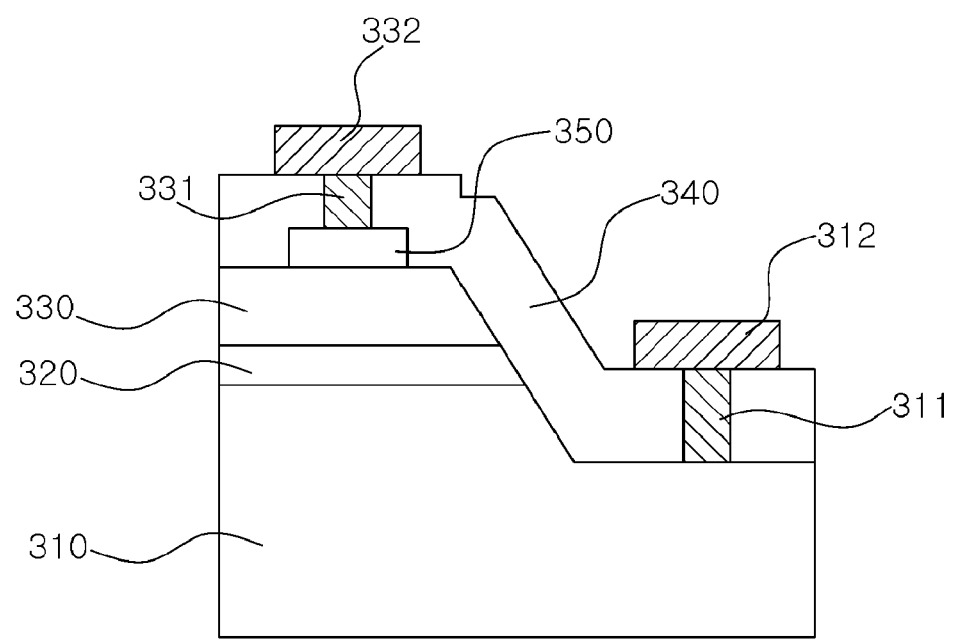
FIG. 3 is a schematic sectional view of a semiconductor light emitting device according to another exemplary embodiment of the present invention.

FIG. 3 is a schematic sectional view of a semiconductor light emitting device according to another exemplary embodiment of the present invention.

With reference to FIG. 3, the semiconductor light emitting device according to the present exemplary embodiment has the same configuration as that of the semiconductor light emitting device according to the former exemplary embodiment described above with reference to FIGS. 1a and 1b, except that a second electrode 331 includes a transparent electrode layer 350 formed between the second electrode 331 and a second conductive semiconductor layer 330, rather than being in direct contact with the second conductive semiconductor layer 330.

The transparent electrode layer 350 may be made of various materials having light transmittance (or transparency), e.g., a material including ITO (Indium Tin Oxide). The transparent electrode layer 350 may also be made of various other materials having high light transmittance and excellent electric conductivity and facilitating current spreading to the entire surface of the second conductive semiconductor layer 330.

Figure 4A:
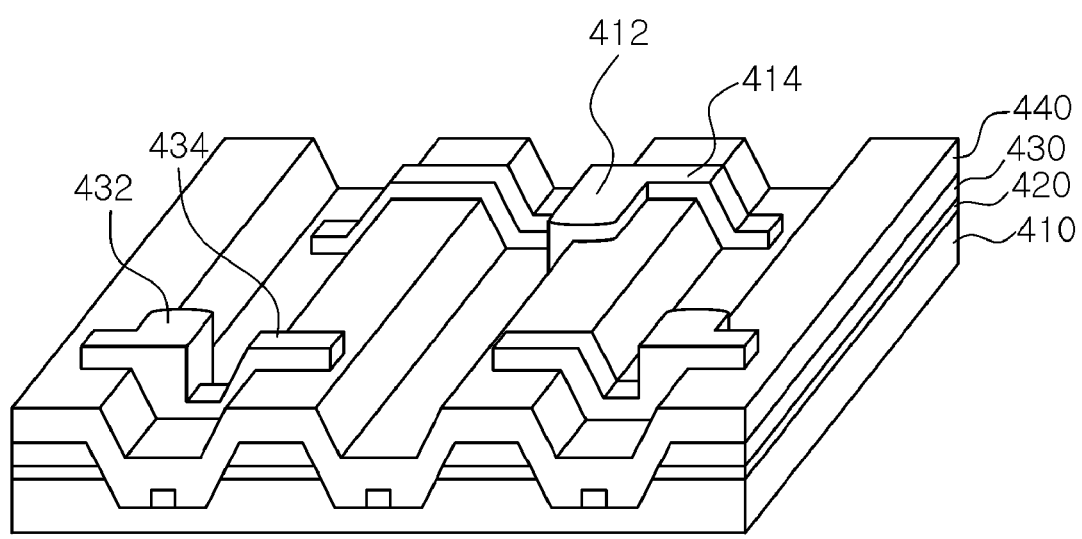
FIGS. 4a to 4e are a schematic perspective view, a plan view, and a sectional view showing a semiconductor light emitting device according to another exemplary embodiment of the present invention.
Figure 4B:
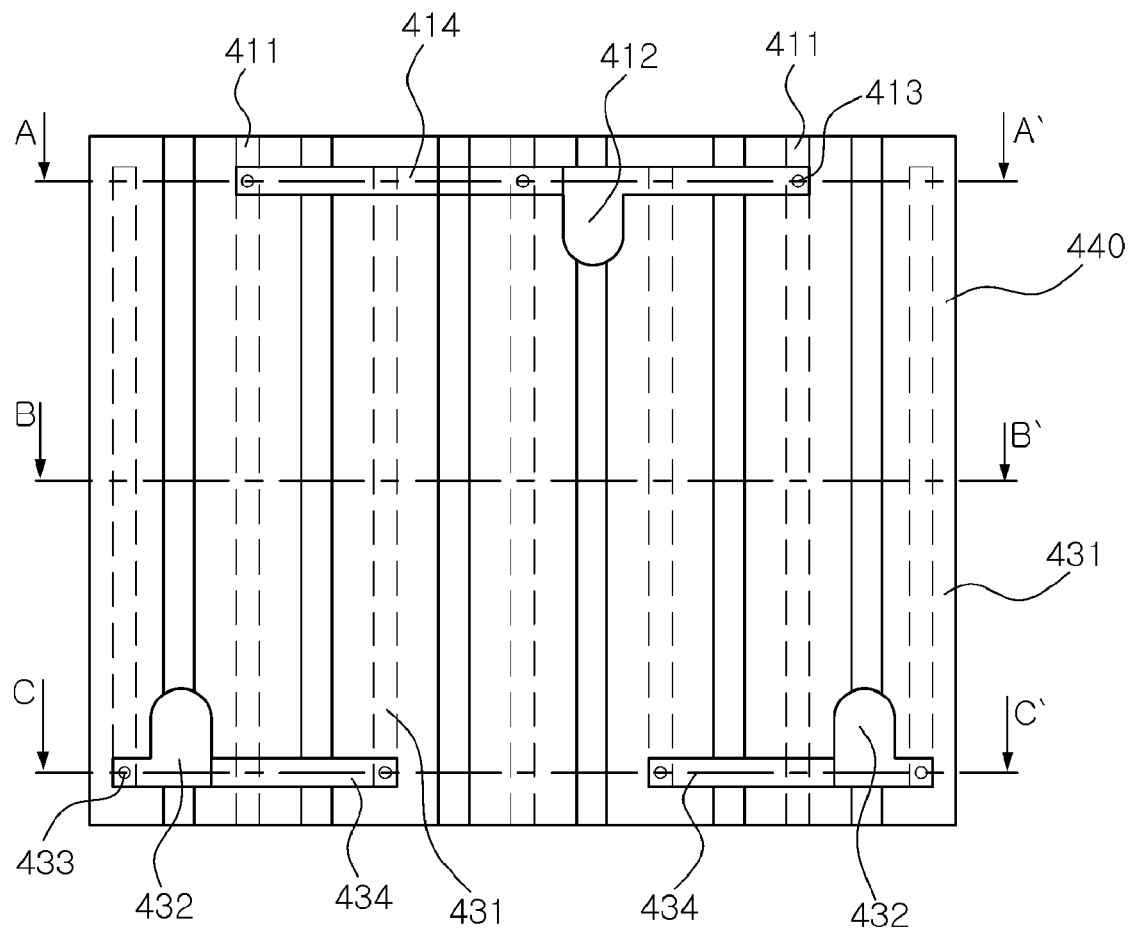
Figure 4C:
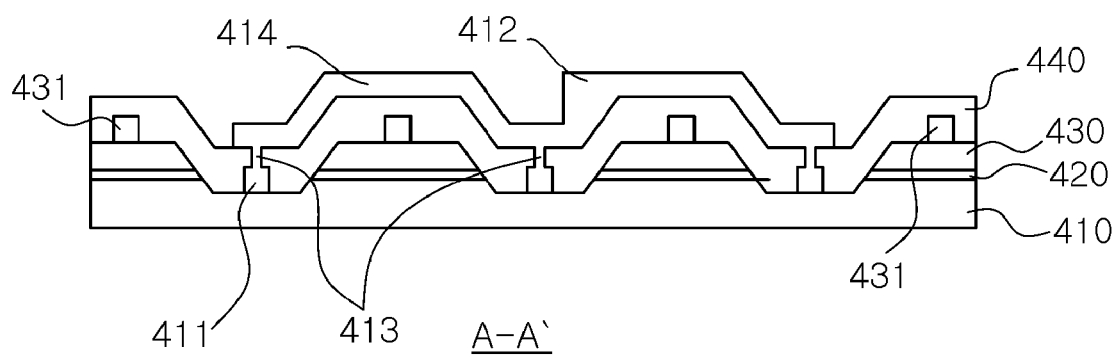
Figure 4D:
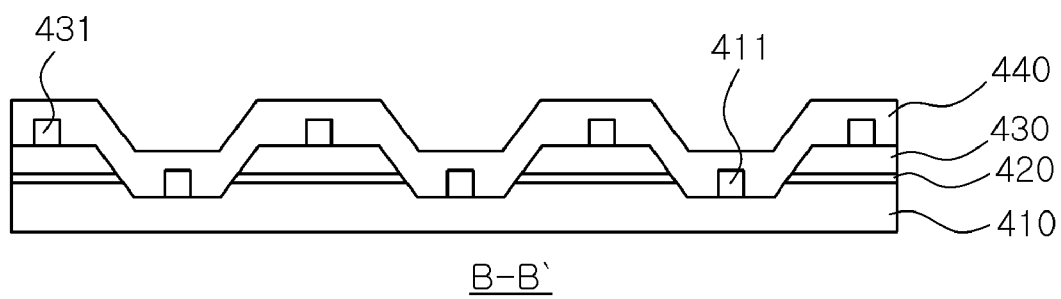
Figure 4E:
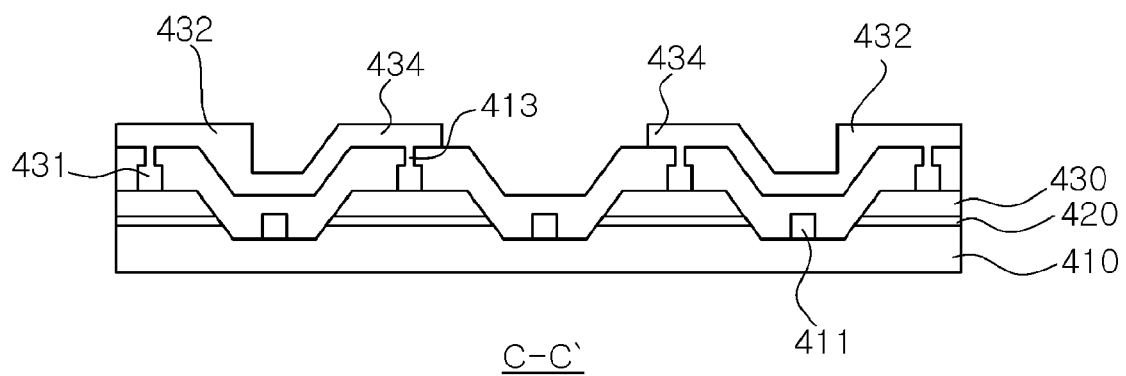

FIGS. 4a to 4e are a schematic perspective view, a plan view, and a sectional view showing a semiconductor light emitting device according to another exemplary embodiment of the present invention. Specifically, FIGS. 4c, 4d, and 4e are sectional views taken along lines A-A', B-B', and C-C' in FIG. 4b.

With reference to FIGS. 4a to 4e, the semiconductor light emitting device according to present exemplary embodiment includes a first conductive semiconductor layer 410 including first and second areas alternately disposed and having a stripe shape, an active layer 420 disposed on the second area, a second conductive semiconductor layer 430 disposed on the active layer 420, first and second electrode branches 411 and 431, a first electrode pad electrically connected to the first electrode branch 411 and disposed to be separated from the first conductive semiconductor layer 410, a second electrode pad 432 electrically connected to the second electrode branch 431 and disposed to be separated from the second conductive semiconductor layer 430, and an insulating part 440 formed on the first and second conductive semiconductor layers 410 and 430. At least one first conductive via 413 electrically connected to the first electrode branch 411 and at least one second conductive via 433 electrically connected to the second electrode branch 431 may be penetratingly formed through portions of the insulating part 440 in a thicknesswise direction.

The first and second electrode branches 411 and 431 are formed to be parallel to each other, have a linear shape, and are alternately disposed. A first connection part 414 extends from the first electrode pad 412 to the first conductive via 413 along the upper surface of the insulating part 440 and a second connection part 434 extends from the second electrode pad 432 to the second conductive via 433 along the upper surface of the insulating part 440.

Namely, in the present exemplary embodiment, the plurality of first and second electrode branches 411 and 431 are alternately disposed. Hereinafter, the respective elements and their connective relationships within the semiconductor light emitting device according to the present exemplary embodiment will now be described in detail with reference to the accompanying drawings.

In the present exemplary embodiment, the first and second conductive semiconductor layers formed on the first and second area, respectively, may have a protrusion and depression structure having a stripe shape in which protrusions and depresses are alternately repeated.

As discussed above, the first and second electrode branches 411 and 431 are electrically connected to the first and second conductive semiconductor layers 410 and 430, and may be alternately disposed to have a stripe shape. With this structure, the interval between the first and second electrode branches 411 and 431 can be uniform, and according to an embodiment, a larger number of first and second electrode branches 411 and 431 may be disposed so that the interval between the first and second electrode branches 411 and 431 becomes narrower. Accordingly, when current is applied through the electrode branches, a current flow in the interior of the first and second conductive semiconductor layers 410 and 430 electrically connected to the electrode branches can uniformly spread in the area between the first and second electrode branches 411 and 431, rather than being concentrated in one area.

A plurality of first conductive vias 413 may be formed at an area of the insulating part 440 such that they are electrically connected to the first electrode branches 411 through the insulating part 440 (i.e., in a penetrative manner) in a thicknesswise direction, and a plurality of one second conductive via 433 may be formed at an area of the insulating part 440 such that they are electrically connected to the second electrode branches 431 through the insulating part 440 (i.e., in a penetrative manner) in a thicknesswise direction. In this case, the upper surface of the insulating part 440 has a rectangular shape, and the first and second conductive vias 413 and 433 may be disposed to be adjacent to one side and the other side opposed to the one side, respectively, when viewed from above. Namely, as shown in FIG. 4b, the first and second conductive vias 413 and 433 may be formed in a lengthwise direction along the respective sides. Accordingly, the first and second conductive vias 413 and 433 can be separated as far as possible from each other and accordingly, the current spreading effect can be improved.

Also, the first and second conductive vias 413 and 433 can be electrically connected to the first connection part 414 extending from the first electrode pad 412 to the first conductive via 413 along the upper surface of the insulating part 440 and a second connection part 434 extending from the second electrode pad 432 to the second conductive via 433 along the upper surface of the insulating part 440, respectively. In this case, as described above, when the plurality of first and second conductive vias 413 and 1433 are formed in the lengthwise direction along the respective sides, the first and second connection parts 414 and 434 extend along the formation direction so as to be electrically connected to the first and second conductive vias 413 and 433. Because the first and second electrode pads 412 and 432 and the first and second conductive vias 413 and 433 are connected by the first and second connection parts 414 and 434, new elements, the first and second pads 412 and 432 can be electrically connected through the first and second through the first and second connection parts 414 and 434, without having to be provided to every first and second electrode branches 411 and 431. In particular, as mentioned above with reference to the configuration illustrated in FIGS. 1 to 3, the first and second pads 412 and 432 may not be limitedly disposed on the first and second branch electrodes 411 and 431; namely, the first and second pads 412 and 432 may be variably selectively disposed on any area of the upper surface of the insulating part 440 according to embodiments.

One first electrode pad and one second electrode pad may be formed or a plurality of first and second electrode pads may be formed according to embodiments. In the present invention, one first electrode pad 412 and two second electrode pads 432 are illustrated to be disposed. In this case, the first and second electrode pads 412 and 432 are formed to be adjacent to the sides opposed on the upper surface of the insulating part 440 having a rectangular shape and, in particular, the first electrode pad 412 is positioned at an area spaced apart by the same distance from the two second electrode pads 432, the current can spread more effectively.

As set forth above, according to exemplary embodiments of the invention, light extraction efficiency can be improved by implementing excellent current spreading.

While the present invention has been shown and described in connection with the exemplary embodiments, it will be apparent to those skilled in the art that modifications and variations can be made without departing from the spirit and scope of the invention as defined by the appended claims.

What is claimed is:

1. A semiconductor light emitting device comprising:
a first conductive semiconductor layer including first and second areas in a plan view;
an active layer disposed on the second area;
a second conductive semiconductor layer disposed on the active layer;
first and second electrode branches disposed on the first and second conductive semiconductor layers, respectively;
a first electrode pad electrically connected to the first electrode branch and disposed on the first electrode branch;
a second electrode pad electrically connected to the second electrode branch and disposed on the second electrode branch; and
a transparent electrode layer disposed on the upper surface of the second conductive semiconductor layer;
wherein the first and second electrode branches have a stripe shape in the plan view and widths of the electrode branches at least nearest contact regions between branches and pads are less than widths of the pads.

2. The device of claim 1, wherein the first and second electrode branches are laterally disposed and mutually parallel.

3. The device of claim 1, wherein the second electrode branch is disposed on an upper surface of the transparent electrode layer.

4. A semiconductor light emitting device comprising:
a first conductive semiconductor layer including first and second areas;
an active layer disposed on the second area;
a second conductive semiconductor layer disposed on the active layer;
first and second electrode branches disposed on the first and second conductive semiconductor layers, respectively;
an insulating part disposed on the first and second conductive semiconductor layers, the insulating part allows at least a portion of each of upper surfaces of the first and second electrode branches to be exposed;
a first electrode pad covering the upper surface of the first electrode branch and at least a portion of upper surface of the insulating part;

a second electrode pad covering the upper surface of the second electrode branch and at least a portion of upper surface of the insulating part; and a transparent electrode layer disposed on the upper surface of the second conductive semiconductor layer;

wherein the first and second electrode pads are electrically connected to the first and second electrode branches respectively; and widths of the electrode branches at least nearest contact regions between branches and pads are less than widths of the pads.

5. The device of claim 4, wherein a plurality of first and second electrode branches are alternately disposed.

6. The device of claim 4, wherein the first and second electrode branches are laterally disposed and mutually parallel.

7. The device of claim 4, wherein the insulating part allows at least a portion of each of upper surfaces of the first and second electrode branches to be exposed.

8. The device of claim 7, wherein the insulating part allows at least a portion of each of upper surfaces of the first and second electrode branches to be exposed.

9. The device of claim 8, wherein the first and second electrode pads are disposed on the exposed portions of the upper surfaces of the first and second electrode branches, respectively.

10. The device of claim 4, wherein the second electrode branch is disposed on an upper surface of the transparent electrode layer.

* * * * *